(12) United States Patent
Kim et al.

(10) Patent No.: US 10,566,284 B2
(45) Date of Patent: Feb. 18, 2020

(54) SEMICONDUCTOR DEVICE

(71) Applicant: Samsung Electronics Co., Ltd., Suwon-si, Gyeonggi-do (KR)

(72) Inventors: Jun Kwan Kim, Seoul (KR); Sanghoon Ahn, Hwaseong-si (KR); Kyu-Hee Han, Hwaseong-si (KR); JaeWha Park, Yongin-si (KR); Heesook Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/027,484

(22) Filed: Jul. 5, 2018

(65) Prior Publication Data
US 2019/0157214 A1 May 23, 2019

(30) Foreign Application Priority Data

Nov. 21, 2017 (KR) ........................ 10-2017-0155870

(51) Int. Cl.
H01L 23/532 (2006.01)
H01L 23/522 (2006.01)
(52) U.S. Cl.
CPC .... H01L 23/53295 (2013.01); H01L 23/5226 (2013.01)
(58) Field of Classification Search
CPC . H01L 27/11502–11514; H01L 23/532; H01L 23/5226
See application file for complete search history.

(56) References Cited

U.S. PATENT DOCUMENTS

| 6,611,449 | B1 | 8/2003 | Hilliger |
| 6,764,899 | B2 | 7/2004 | Yoon |
| 7,348,617 | B2 | 3/2008 | Kumura et al. |
| 7,507,621 | B2 | 3/2009 | Miura |
| 7,781,812 | B2 | 8/2010 | Izumi |
| 8,658,493 | B2 | 2/2014 | Nagai |
| 9,847,338 | B2 | 12/2017 | Nakao |
| 2005/0002266 | A1* | 1/2005 | Kanaya ............ H01L 27/11507 365/232 |
| 2007/0134817 | A1 | 6/2007 | Noda |
| 2014/0084352 | A1* | 3/2014 | Beecher ................. G06F 17/50 257/295 |
| 2015/0206893 | A1* | 7/2015 | Sun ................... H01L 27/11507 257/532 |

* cited by examiner

Primary Examiner — Tucker J Wright
Assistant Examiner — Wilner Jean Baptiste
(74) Attorney, Agent, or Firm — Harness, Dickey & Pierce, P.L.C.

(57) ABSTRACT

Provided is a semiconductor device comprising a device region on a substrate, an interlayer dielectric layer on the device region, a first interface layer on a side of the interlayer dielectric layer, a low-k dielectric layer spaced apart from the interlayer dielectric layer across the first interface layer and having a dielectric constant less than that of the interlayer dielectric layer, and a conductive line in the low-k dielectric layer. The first interface layer comprises a first sub-interface layer in contact with the low-k dielectric layer, and a second sub-interface layer in contact with the interlayer dielectric layer. The second sub-interface layer has hydrogen permeability less than that of the first sub-interface layer.

20 Claims, 18 Drawing Sheets

COMPARATIVE EXAMPLE

SEMICONDUCTOR DEVICE

CROSS-REFERENCE TO RELATED APPLICATIONS

This U.S. nonprovisional patent application claims priority under 35 U.S.C § 119 of Korean Patent Application No. 10-2017-0155870 filed on Nov. 21, 2017, the entire contents of which are hereby incorporated by reference.

BACKGROUND

Inventive concepts relate to a semiconductor device.

Semiconductor devices are beneficial in electronic industry because of their small size, multi-functionality, and/or low fabrication cost. Semiconductor devices have increasingly integrated with the development of electronic industry. Semiconductor devices may be categorized as semiconductor memory devices storing logic data, semiconductor logic devices processing operations of logic data, and hybrid semiconductor devices having both memory and logic elements. It has also been increasingly desired to improve characteristics for semiconductor devices. For example, semiconductor devices have been increasingly requested for high reliability, high speed, and/or multi-functionality. Semiconductor devices are gradually complicated and integrated to meet these requested characteristics.

SUMMARY

Some example embodiments of inventive concepts provide a semiconductor device having enhanced reliability and improved electrical characteristics.

According to example embodiments of inventive concepts, a semiconductor device may comprise: a device region on a substrate; an interlayer dielectric layer on the device region; a first interface layer on a side of the interlayer dielectric layer; a low-k dielectric layer spaced apart from the interlayer dielectric layer across the first interface layer and having a dielectric constant less than that of the interlayer dielectric layer; and a conductive line in the low-k dielectric layer. The first interface layer may comprise: a first sub-interface layer in contact with the low-k dielectric layer; and a second sub-interface layer in contact with the interlayer dielectric layer. The second sub-interface layer may have hydrogen permeability less than that of the first sub-interface layer.

According to example embodiments of inventive concepts, a semiconductor device may comprise: a device region on a substrate; a low-k dielectric layer on the device region and including a conductive line therein; an upper interlayer dielectric layer on the low-k dielectric layer; a hydrogen supply layer on the upper interlayer dielectric layer; and an upper interface layer between the low-k dielectric layer and the upper interlayer dielectric layer. The upper interface layer may comprise a first sub-interface layer and a second sub-interface layer on the first sub-interface layer. The second sub-interface layer may have hydrogen permeability less than that of the first sub-interface layer.

According to example embodiments of inventive concepts, a semiconductor device may comprise: a device region on a substrate; a plurality of low-k dielectric layers on the device region and including conductive lines therein; an interlayer dielectric layer on the low-k dielectric layers; a hydrogen supply layer on the interlayer dielectric layer; and an upper interface layer between the interlayer dielectric layer and an uppermost one of the low-k dielectric layers. The upper interface layer may comprise a low-k dielectric interface layer and a hydrogen blocking layer on the low-k dielectric interface layer. The hydrogen blocking layer may have a density greater than that of the upper interface layer.

DETAILED DESCRIPTION OF EXAMPLE EMBODIMENTS

Hereinafter, some example embodiments of inventive concepts will be described in detail in conjunction with the accompanying drawings to aid in clearly explaining inventive concepts.

Figure 1:
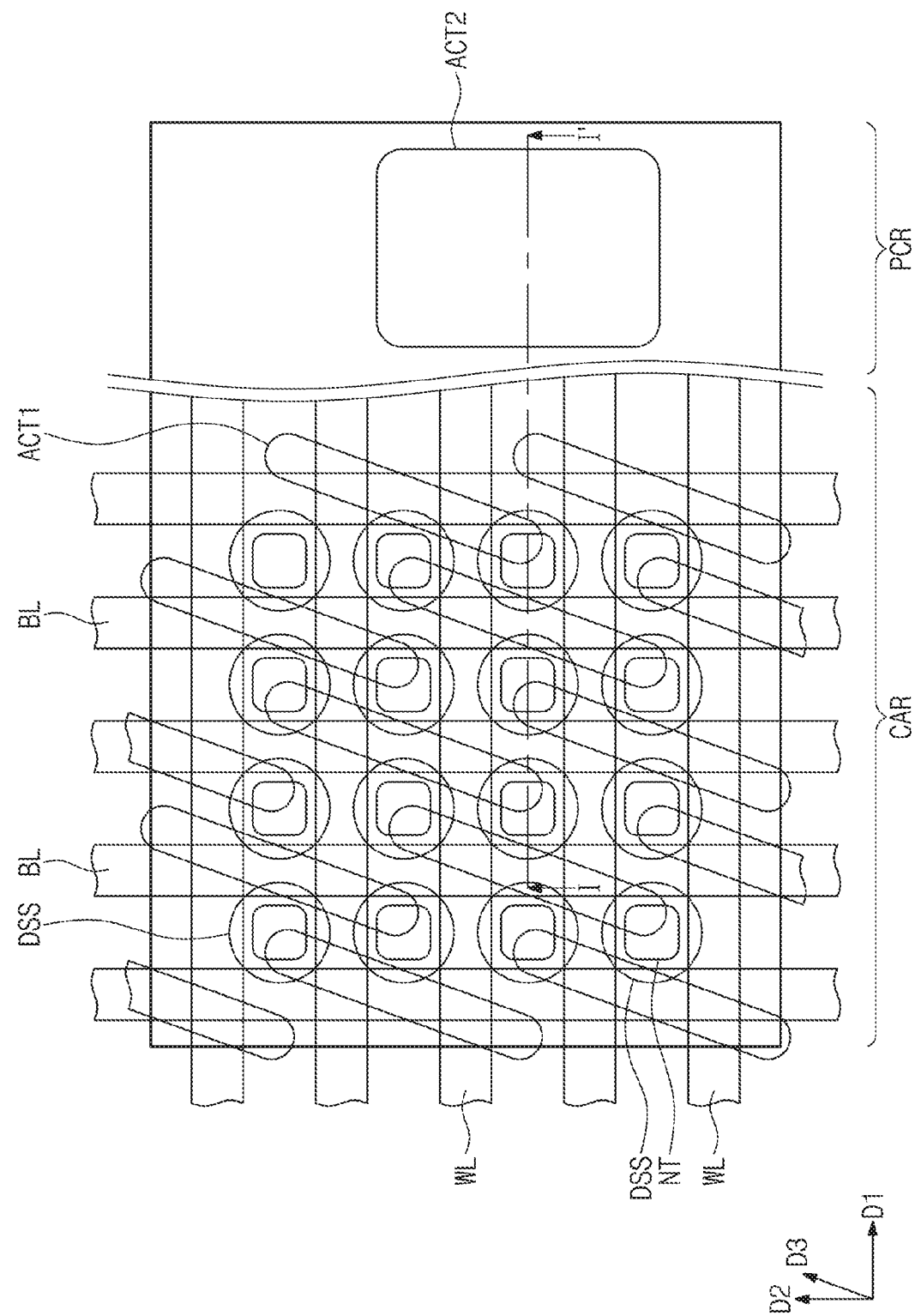
FIG. 1 illustrates a plan view showing a semiconductor device according to example embodiments of inventive concepts.
Figure 2:
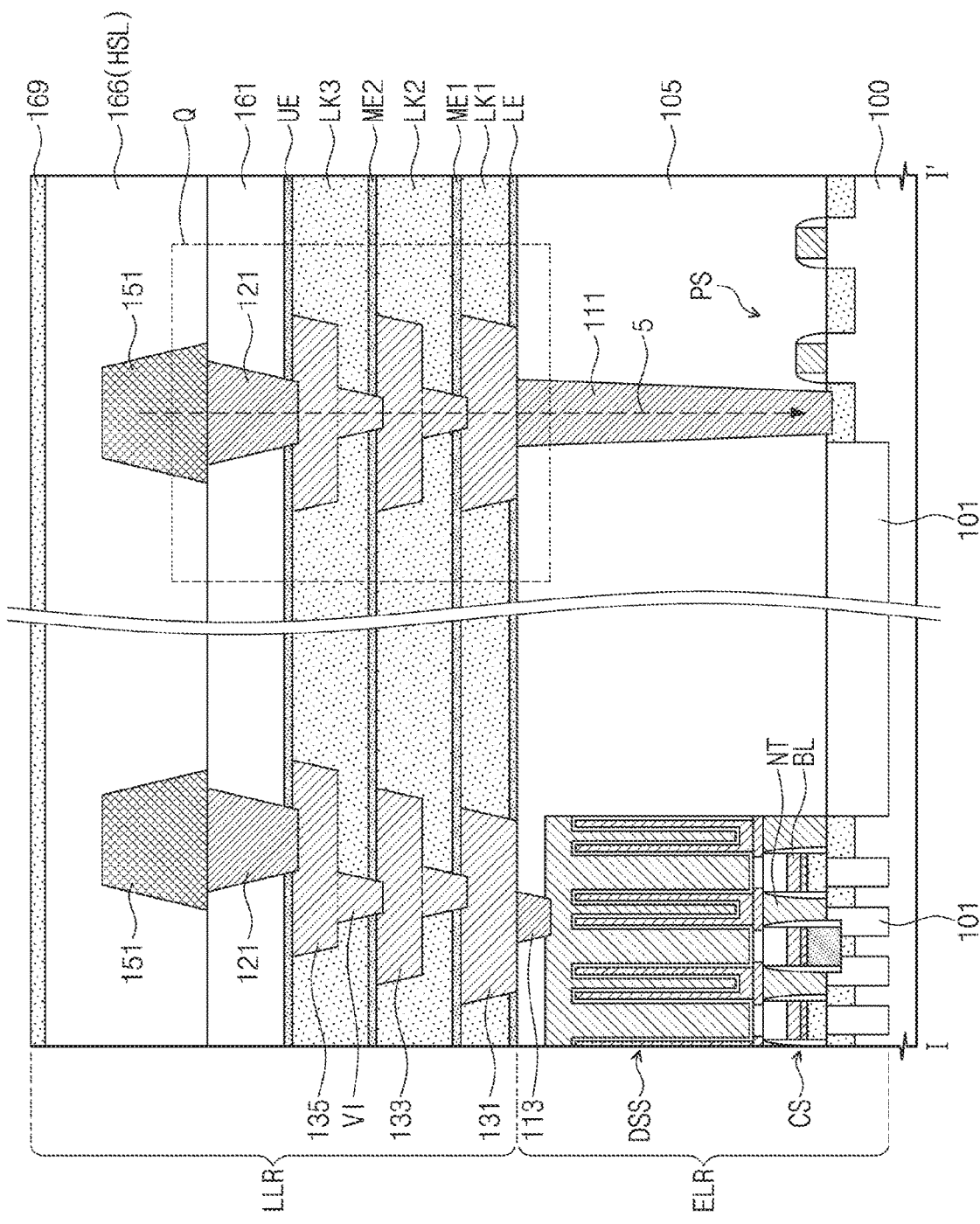
FIG. 2 illustrates a cross-sectional view taken along line I-I' of FIG. 1.
Figure 3:
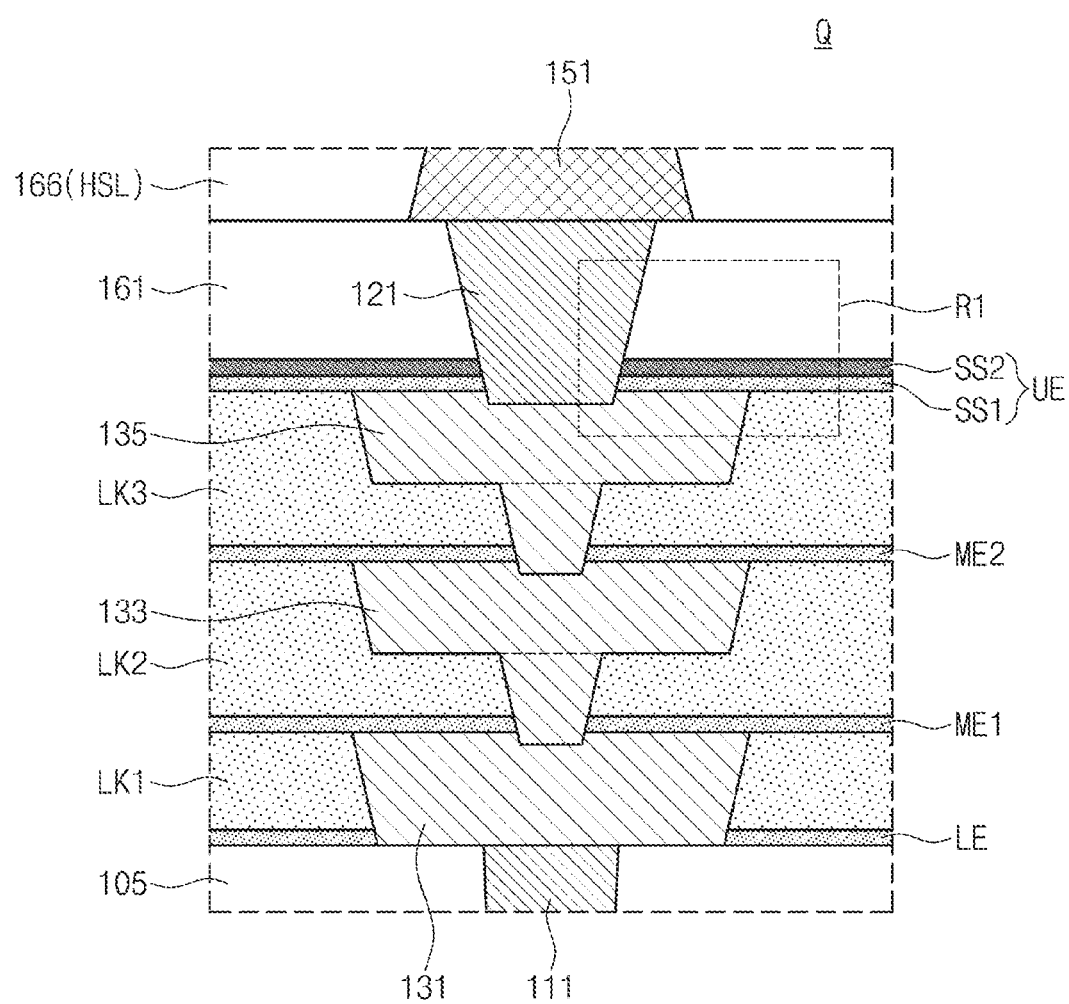
FIG. 3 illustrates an enlarged view showing section Q of FIG. 2.
Figure 4:
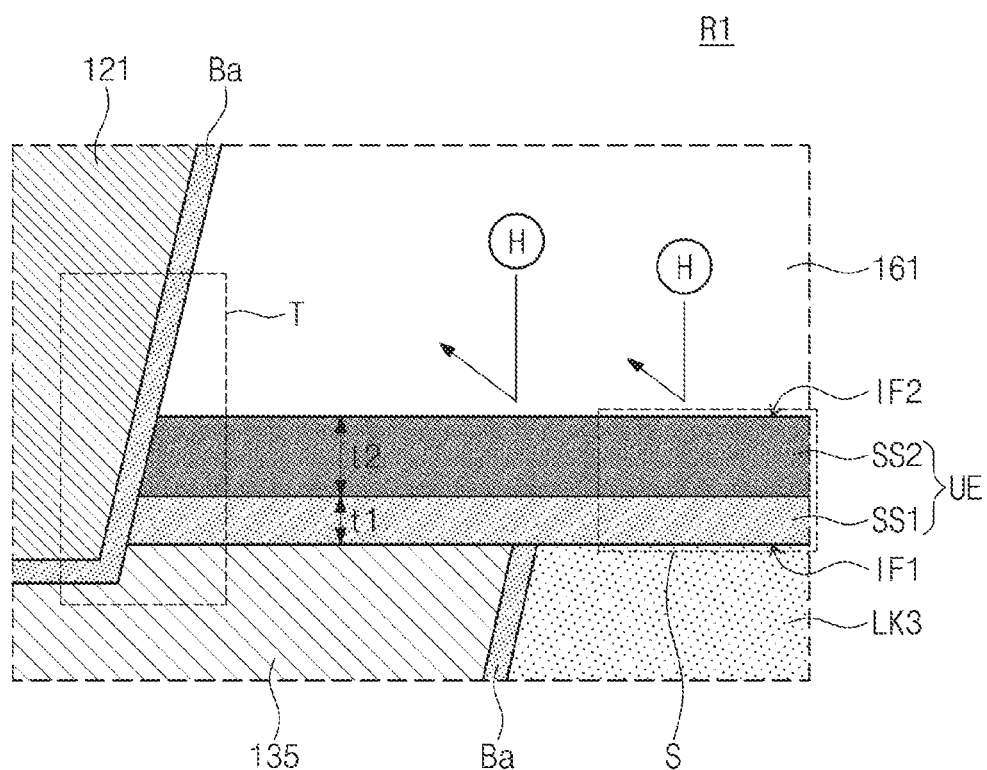
FIG. 4 illustrates an enlarged view showing section R1 of FIG. 3.
Figure 5:
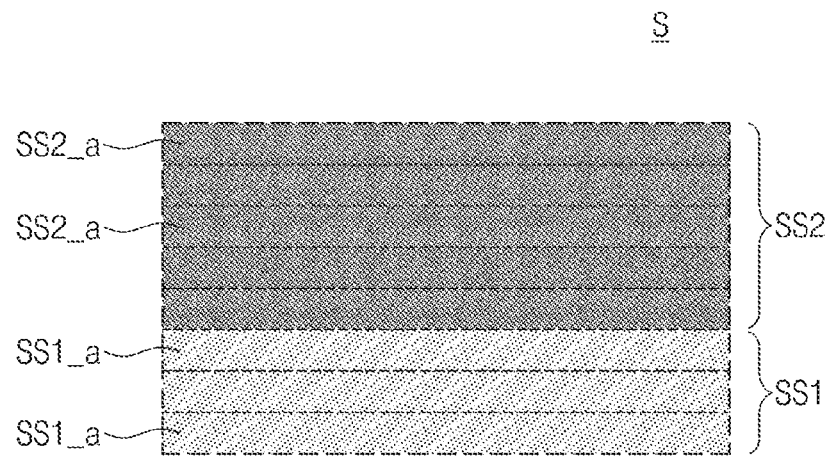
FIG. 5 illustrates an enlarged view showing section S of FIG. 4.
Figure 6:
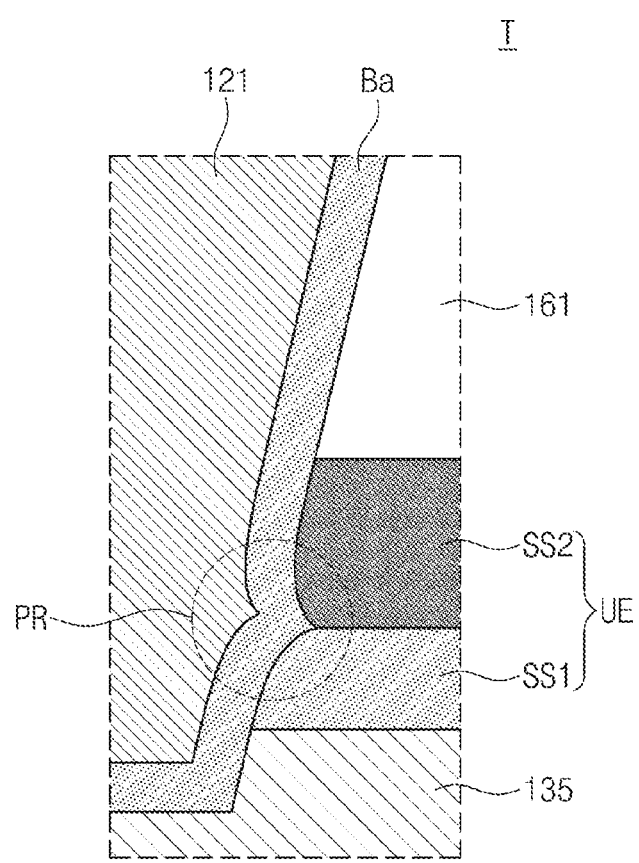
FIG. 6 illustrates an enlarged view showing section T of FIG. 4.
Figure 7:
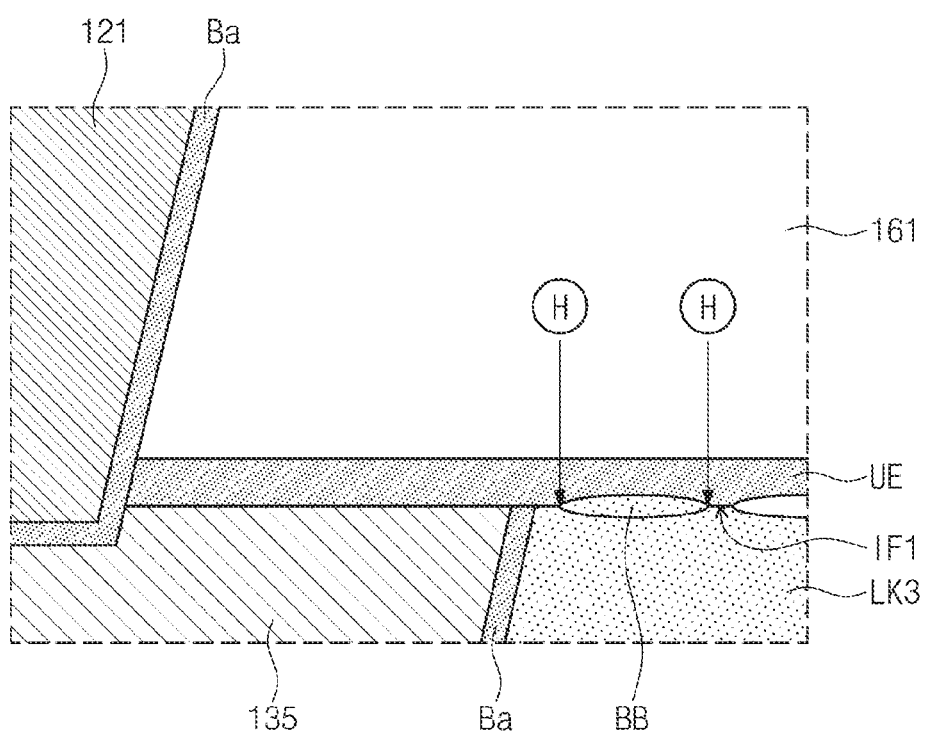
FIG. 7 illustrates a cross-sectional view showing a semiconductor device according to a comparative example.

FIG. 1 illustrates a plan view showing a semiconductor device according to example embodiments of inventive concepts. FIG. 2 illustrates a cross-sectional view taken along line I-I' of FIG. 1. FIG. 3 illustrates an enlarged view showing section Q of FIG. 2. FIG. 4 illustrates an enlarged view showing section R1 of FIG. 3. FIG. 5 illustrates an enlarged view showing section S of FIG. 4. FIG. 6 illustrates an enlarged view showing section T of FIG. 4. FIG. 7 illustrates a cross-sectional view showing a semiconductor device according to a comparative example.

Referring to FIGS. 1 to 5, a semiconductor device may be provided to include a device region ELR and a wiring region LLR on the device region ELR. The device region ELR may be an area including a substrate 100 and a plurality of transistors formed on the substrate 100. When a semiconductor device of inventive concepts is a memory device, the device region ELR may include a cell array region CAR and a peripheral circuit region PCR that drives the cell array region CAR. The cell array region CAR may be a zone provided with memory cells. The peripheral circuit region PCR may be a zone provided with a word line driver, a sense amplifier, row and column decoders, and/or control circuits. Alternatively, when a semiconductor device of inventive concepts is a non-memory device, the device region ELR may include no cell array region CAR. The following will describe some examples of memory devices, but inventive concepts are not limited thereto.

The cell array region CAR may include a cell transistor section CS and a data storage structure DSS on the cell transistor section CS. When a semiconductor memory device of inventive concepts is a dynamic random access memory (DRAM) device, the data storage structure DSS may include capacitors. Each of the capacitors may include a bottom electrode, a top electrode, and a dielectric layer between the bottom electrode and the top electrode.

The cell transistor section CS may include a plurality of unit memory cells each of which includes a first active region ACT1 defined by a device isolation layer 101, a word line WL, and a bit line BL. The substrate 100 may be or include a semiconductor substrate such as a silicon substrate, a germanium substrate, or a silicon-germanium substrate. The first active regions ACT1 provided on an upper portion of the substrate 100 may have bar shapes horizontally separated from each other, and may extend in a third direction D3 non-perpendicular to both first and second directions D1 and D2 that are parallel to a top surface of the substrate 100. For example, the word lines WL may be buried in the upper portion of the substrate 100 while extending in the first direction D1 to run across the first active regions ACT1.

Each of the first active regions ACT1 may be provided therein with a plurality of impurity regions that are separated from each other by the word lines WL. The bit lines BL may intersect the word lines WL to extend in the second direction D2, and may be connected to a plurality of the first active region ACT1. The bit lines BL may be provided therebetween with the data storage structures DSS, for example, node contacts NT connected to the capacitors. The examples discussed above relate to DRAM devices, but inventive concepts are not limited to thereto. For example, a semiconductor memory device of inventive concepts may be a variable resistance memory device including a phase change material or any other memory device.

The peripheral circuit region PCR may include a peripheral transistor section PS. The peripheral transistor section PS may include second active regions ACT2 defined by the device isolation layer 101 and transistors on the second active regions ACT2. A lower interlayer dielectric layer 105 may be provided to cover the peripheral transistor section PS and the cell transistor section CS. For example, the lower interlayer dielectric layer 105 may have a dielectric constant equal to or more than 4.4. The lower interlayer dielectric layer 105 may include, for example, BPSG (boro-phosphosilicate glass), TOSZ (tonen silazene), USG (undoped silicate glass), SOG (spin-on glass), FOX (flowable oxide), TEOS (tetraethylortho silicate), HDP CVD (high density plasma chemical vapor deposition) oxide, or HSQ (hydrogen silisesquioxane).

The wiring region LLR may include interlayer dielectric layers, low-k dielectric layers, and conductive lines formed in the interlayer dielectric layers and the low-k dielectric layers. For example, interlayer dielectric layers 161 and 166 may be provided on low-k dielectric layers LK1, LK2, and LK3. First, second, and third conductive lines 131, 133, and 135 may be provided in the first, second, and third low-k dielectric layers LK1, LK2, and LK3 respectively. The number of the low-k dielectric layers and the number of the conductive lines are not limited to the above mentioned, but may be varied.

In this description, the low-k dielectric layer may indicate an insulation layer having a dielectric constant of less than 4.4. For example, the low-k dielectric layers LK1, LK2, and LK3 may include SiCOH. The first to third conductive lines 131, 133, and 135 may be formed by a damascene process. For example, the first to third conductive lines 131, 133, and 135 may include copper (Cu) or tungsten (W). One or more of the first to third conductive lines 131, 133, and 135 may be formed by a dual damascene process. For example, each of the second and third conductive lines 133 and 135 may have a linear structure which extends in one direction and whose bottom surface is provided with a via VI. As a result of the damascene process, each of the first to third conductive lines 131, 133, and 135 may have a lower width and an upper width greater than the lower width, but not limited thereto.

One or more of the first to third low-k dielectric layers LK1, LK2, and LK3 may have different thicknesses from each other. For example, the first low-k dielectric layer LK1 may have a thickness less than those of the second and third low-k dielectric layers LK2 and LK3. The first to third low-k dielectric layers LK1, LK2, and LK3 may be formed of the same material, but not limited thereto. For example, one or more of the first to third low-k dielectric layers LK1, LK2, and LK3 may be formed of a material having different dielectric constant and/or composition.

One of the first conductive lines 131 that is on the cell array region CAR may be connected through a second lower contact 113 to an upper portion of the data storage structure DSS, for example, to the top electrode of the capacitor. Another of the first conductive lines 131 that is on the peripheral circuit region PCR may be connected through a first lower contact 111 to the peripheral transistor section PS. For example, the first lower contact 111 may be connected to a source/drain region of peripheral transistor. The first and second lower contacts 111 and 113 may include one or more of tungsten (W), titanium (Ti), tantalum (Ta), and nitride thereof.

An increase in integration of semiconductor devices decreases widths and intervals of conductive lines. When a low-k dielectric layer is used as an insulation layer provided therein with the conductive lines according to some example embodiments of inventive concepts, it may be possible to reduce a capacitive coupling between the conductive lines.

An upper interlayer dielectric layer may be provided on the third low-k dielectric layer LK3. The upper interlayer dielectric layer may include a first interlayer dielectric layer 161 and a second interlayer dielectric layer 166. The first and second interlayer dielectric layers 161 and 166 may be insulation layers whose dielectric constant is greater than those of the low-k dielectric layers LK1, LK2, and LK3. For example, each of the first and second interlayer dielectric layers 161 and 166 may have a dielectric constant equal to or more than 4.4. The first and second interlayer dielectric layers 161 and 166 may include BPSG (boro-phosphosilicate glass), TOSZ (tonen silazene), USG (undoped silicate glass), SOG (spin-on glass), FOX (flowable oxide), TEOS (tetraethylortho silicate), HDP CVD (high density plasma chemical vapor deposition) dielectric, or HSQ (hydrogen silisesquioxane). In this description, the HDP CVD dielectric is hereinafter referred to as an HDP layer.

Upper contacts 121 may be provided in the first interlayer dielectric layer 161. Upper conductive lines 151 may be provided in the second interlayer dielectric layer 166. The upper contacts 121 may penetrate the first interlayer dielectric layer 161 such that the upper conductive lines 151 may be connected to the third conductive lines 135. For example, the upper contacts 121 may include one or more of tungsten (W), titanium (Ti), tantalum (Ta), and nitride thereof. The upper conductive lines 151 may include a conductive material different from those of the first to third conductive lines 131, 133, and 135. For example, the upper conductive lines 151 may include aluminum (Al). The second interlayer dielectric layer 166 may cover the upper conductive lines 151.

One or more of the conductive lines 131, 133, 135, and 151 and the contacts 111, 113, and 121 may include a barrier layer Ba. The barrier layer Ba may include conductive metal nitride such as titanium nitride or tantalum nitride.

A passivation layer 169 may be provided on the second interlayer dielectric layer 166. The passivation layer 169 may include a material whose density is greater than those of the first and second interlayer dielectric layers 161 and 166. For example, the passivation layer 169 may include silicon nitride.

When defects occur in unit element during an oxidation process, a plasma etching process, or the like in manufacturing semiconductor devices, the defects may lead to a decrease in electrical characteristics. For example, leakage current may increase due to dangling bonds formed between a silicon oxide layer and a silicon substrate in the unit element, thereby deteriorating electrical characteristics of semiconductor devices. DRAM semiconductor devices perform a refresh operation at a regular interval to newly store existing data. The regular interval is called a refresh period or a data retention time. Reducing the data retention time saves power consumption of DRAM semiconductor devices and/or increases operating speeds. However, silicon crystal defects such as dangling bonds may increase the leakage current of transistors and/or decrease the data retention time.

One or more of the first and second interlayer dielectric layers 161 and 166 may be a hydrogen supply layer. For example, the second interlayer dielectric layer 166 may have a hydrogen supply capability relatively higher than that of the first interlayer dielectric layer 161. For example, the first interlayer dielectric layer 161 may be a TEOS layer, and the second interlayer dielectric layer 166 may be an HDP layer. Alternatively, both of the first and second interlayer dielectric layers 161 and 166 may be an HDP layer. Also, the second interlayer dielectric layer 166 may be a TEOS layer, and the first interlayer dielectric layer 161 may be an HDP layer. It will be hereinafter described an example in which the second interlayer dielectric layer 166 is the hydrogen supply layer HSL, but example embodiments of inventive concepts are not limited thereto.

According to some example embodiments of inventive concepts, transistors may be supplied with hydrogen capable of supplying electrons to dangling bonds, with the result that the data retention time may be prevented from being reduced. For example, the hydrogen supply layer HSL may be disposed as an interlayer dielectric layer in the wiring region LLR. When hydrogen is supplied through the hydrogen supply layer HSL, it may be less affected by layers that block the hydrogen diffusion, compared to the case when an annealing is performed under a hydrogen gas atmosphere.

The hydrogen supply layer HSL may supply hydrogen through the conductive lines 131, 133, 135, and 151 and the contacts 111, 113, and 121 to the transistors on the peripheral transistor section PS and/or to the transistors on the cell transistor section CS in an alloy process which will be discussed below with reference to FIG. 19. For example, the conductive lines 131, 133, 135, and 151 and the contacts 111, 113, and 121 may serve as a hydrogen transfer path 5 through which hydrogen is supplied from the hydrogen supply layer HSL to the transistors on the substrate 100. FIG. 2 shows the hydrogen transfer path 5 to illustrate one example, and there may be variously provided other hydrogen transfer paths through the conductive lines 131, 133, 135, and 151 and the contacts 111, 113, and 121.

Interface layers may be provided between the low-k dielectric layers LK1, LK2, and LK3 and the interlayer dielectric layers 105, 161, and 166. For example, an upper interface layer UE may be provided between the third low-k dielectric layer LK3 and the first interlayer dielectric layer 161, and a lower interface layer LE may be provided between the first low-k dielectric layer LK1 and the lower interlayer dielectric layer 105. The upper interface layer UE may be one of interface layers that is in contact with an uppermost one of the low-k dielectric layers LK1, LK2, and LK3, and the lower interface layer LE may be one of interface layers that is in contact with a lowermost one of the low-k dielectric layers LK1, LK2, and LK3.

Middle interface layers ME1 and ME2 may be provided between the low-k dielectric layers LK1, LK2, and LK3. For example, a first middle interface layer ME1 may be provided between the first low-k dielectric layer LK1 and the second low-k dielectric layer LK2, and a second middle interface layer ME2 may be provided between the second low-k dielectric layer LK2 and the third low-k dielectric layer LK3.

One or more of the upper and lower interface layers UE and LE may include a plurality of insulation layers having different characteristics from each other. For example, as illustrated in FIGS. 3 to 6, the upper interface layer UE may include a first sub-interface layer SS1 in contact with the third low-k dielectric layer LK3 and a second sub-interface layer SS2 in contact with the first interlayer dielectric layer 161. In contrast, each of the lower interface layer LE and the first and second middle interface layers ME1 and ME2 may not include the second sub-interface layer SS2, but include a single layer including the same material as that of the first sub-interface layer SS1.

The second sub-interface layer SS2 may include a material exhibiting hydrogen permeability less than that of the first sub-interface layer SS1. In this sense, the second sub-interface layer SS2 may serve as a hydrogen blocking layer. The second sub-interface layer SS2 may be disposed on a top surface of the first sub-interface layer SS1, or between the first sub-interface layer SS1 and the hydrogen supply layer HSL. As illustrated in FIG. 4, since the second sub-interface layer SS2 serves as a hydrogen blocking layer having hydrogen permeability less than that of the first sub-interface layer SS1, the second sub-interface layer SS2 may compel the hydrogen supply layer HSL to introduce hydrogen H toward the upper contact 121. For example, hydrogen H supplied from the hydrogen supply layer HSL may be a hydrogen atom or a hydrogen molecule. As a result, hydrogen may be concentrated onto the hydrogen transfer path 5, and therefore supplied to the transistors on the substrate 100. Accordingly, it may be possible to increase efficiency of an alloy process which will be discussed below.

FIG. 7 illustrates a cross-sectional view showing a semiconductor device according to a comparative example. When the upper interface layer UE is a single layer consisting of the first sub-interface layer SS1, it may be likely that hydrogen H passes through the upper interface layer UE without being induced to the hydrogen transfer path 5. Hydrogen H that has passed through the upper interface layer UE may form bubbles BB at a first interface IF1 between the upper interface layer UE and the third low-k dielectric layer LK3. The bubbles BB may cause the upper interface layer UE and the third low-k dielectric layer LK3 to delaminate from each other at the first interface IF1, and/or a misalignment may occur when the bubbles BB are formed on an alignment key. According to some example embodiments of inventive concepts, the peeling-off and/or the misalignment may be reduced and/or prevented, and thus a semiconductor device may increase in reliability.

The second sub-interface layer SS2 may have a density greater than that of the first sub-interface layer SS1. For example, the density of the second sub-interface layer SS2 may be about 1.1 times or about 3 times the density of the first sub-interface layer SS1. The first sub-interface layer SS1 may have an open internal structure containing therein a large number of pores connected to each other, compared to the second sub-interface layer SS2.

The first sub-interface layer SS1 may be a low-k dielectric interface layer whose dielectric constant is less than that of the second sub-interface layer SS2. For example, the first sub-interface layer SS1 may have a dielectric constant of less than 6, and the second sub-interface layer SS2 may have a dielectric constant equal to or more than 6. The first sub-interface layer SS1 may cover at least a portion of a top surface of the third conductive line 135, serving as a diffusion stop layer together with the barrier layer Ba.

The first sub-interface layer SS1 may have a greater interface adhesion force with the third low-k dielectric layer LK3 than with the second sub-interface layer SS2. The second sub-interface layer SS2 may have a greater interface adhesion force with the first interlayer dielectric layer 161 than with the first sub-interface layer SS1. For example, the first sub-interface layer SS1 may have an excellent interface adhesion force with the third low-k dielectric layer LK3 at the first interface IF1, and the second sub-interface layer SS2 may have an excellent interface adhesion force with the first interlayer dielectric layer 161 at a second interface IF2 opposite to the first interface IF1.

The first sub-interface layer SS1 may include Si, C, or N. For example, the first sub-interface layer SS1 may include SiCN. In other example embodiments, the first sub-interface layer SS1 may include BN, BCN, AlN, or AlCN. When the first sub-interface layer SS1 includes carbon such as SiCN, a concentration of carbon may fall within a range from about 10 wt % to about 50 wt %.

The second sub-interface layer SS2 may include Si or N. For example, the second sub-interface layer SS2 may include SiN. In other example embodiments, the second sub-interface layer SS2 may include $Al_2O_3$, BN, or AlN.

The first sub-interface layer SS1 may have the same thickness as that of the second sub-interface layer SS2. Alternatively, the second sub-interface layer SS2 may be thicker than the first sub-interface layer SS1. For example, the second sub-interface layer SS2 may have a thickness t2 about 2 times to about 10 times a thickness t1 of the first sub-interface layer SS1. For example, the thickness t1 of the first sub-interface layer SS1 may fall within a range from about 100 Å to about 500 Å. The thickness t2 of the second sub-interface layer SS2 may fall within a range from about 400 Å to about 1000 Å. The third low-k dielectric layer LK3 may have a thickness about 3 times to 5 times that of the upper interface layer UE. For example, the thickness of the third low-k dielectric layer LK3 may fall within a range from about 3000 Å to about 5000 Å, and the thickness of the upper interface layer UE may fall within a range from about 500 Å to about 1500 Å.

The first and second sub-interface layers SS1 and SS2 may be formed of different materials from each other, having different etching characteristics from each other. Moreover, an interface between the first and second sub-interface layers SS1 and SS2 may be etched at a relatively high speed due to high interfacial energy. As a result, as illustrated in FIG. 6, a recession PR may be formed between the first and second sub-interface layers SS1 and SS2. The recession PR may be filled with the upper contact 121 adjacent thereto. For example, when the upper contact 121 includes the barrier layer Ba, the recession PR may be filled with the barrier layer Ba.

As illustrated in FIG. 5, each of the first and second sub-interface layers SS1 and SS2 may include a plurality of layers. For example, the first sub-interface layer SS1 may include a plurality of layers SS1_a, and the second sub-interface layer SS2 may include a plurality of layers SS2_a. The plurality of layers SS1_a and SS2_a may be formed by a deposition process performed several times, and interfaces between the plurality of layers SS1_a and SS2_a may be or not be observed depending on process recipes.

Figure 8:
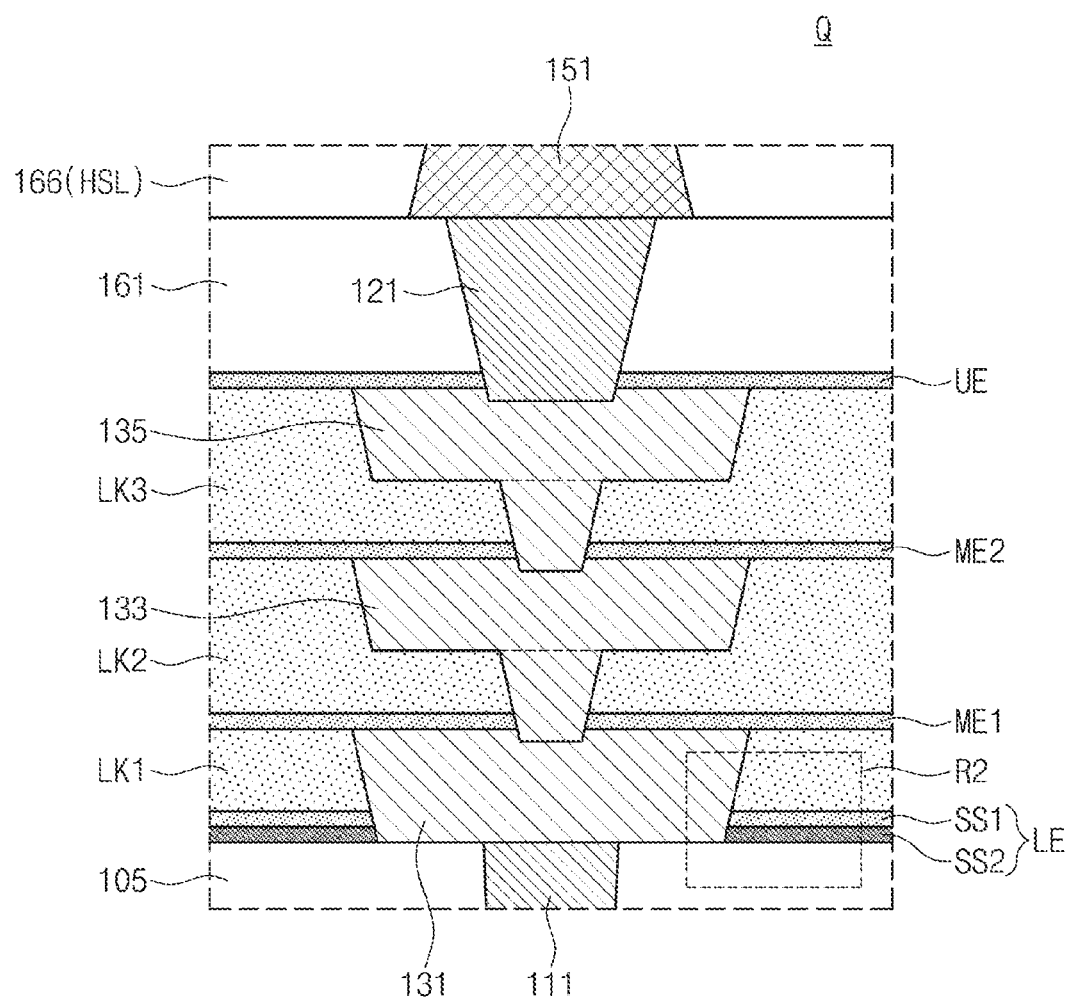
FIG. 8 illustrates an enlarged view showing section Q of FIG. 2.
Figure 9:
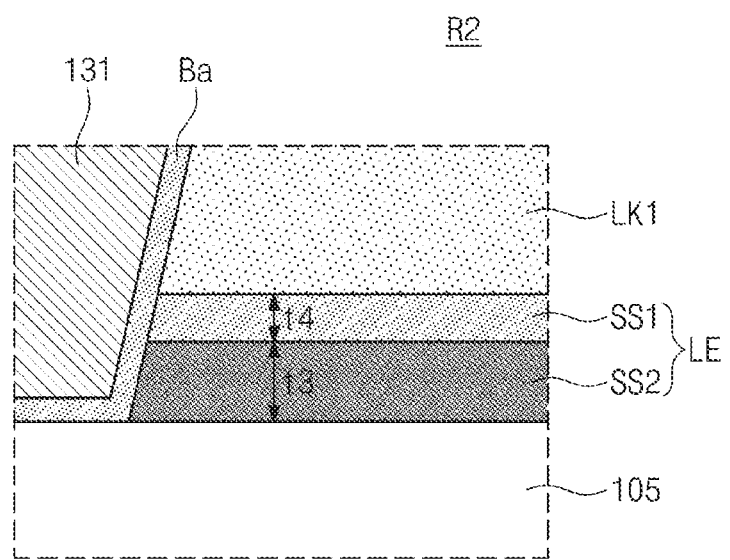
FIG. 9 illustrates an enlarged view showing section R2 of FIG. 8.

FIG. 8 illustrates an enlarged view showing section Q of FIG. 2. FIG. 9 illustrates an enlarged view showing section R2 of FIG. 8. A description of the same or corresponding components will be omitted for brevity.

Referring to FIGS. 8 and 9, the lower interface layer LE according to some example embodiments of inventive concepts may include the second sub-interface layer SS2 and the first sub-interface layer SS1 on the second sub-interface layer SS2. In contrast, each of the upper interface layer UE and the first and second middle interface layers ME1 and ME2 need not include the second sub-interface layer SS2, but include a single layer consisting of the same material as that of the first sub-interface layer SS1. The first sub-interface layer SS1 may be in contact with the first low-k dielectric layer LK1, and the second sub-interface layer SS2 may be in contact with the lower interlayer dielectric layer 105. The second sub-interface layer SS2 may include a material exhibiting hydrogen permeability less than that of the first sub-interface layer SS1.

The first sub-interface layer SS1 may have a greater interface adhesion force with the first low-k dielectric layer LK1 than with the second sub-interface layer SS2. The second sub-interface layer SS2 may have a greater interface adhesion force with the lower interlayer dielectric layer 105 than with the first sub-interface layer SS1. The first and second sub-interface layers SS1 and SS2 may have the same characteristics as those discussed with reference to FIGS. 3 to 6. For example, in example embodiments, the second sub-interface layer SS2 may have a thickness t3 greater than a thickness t4 of the first sub-interface layer SS1.

Figure 10:
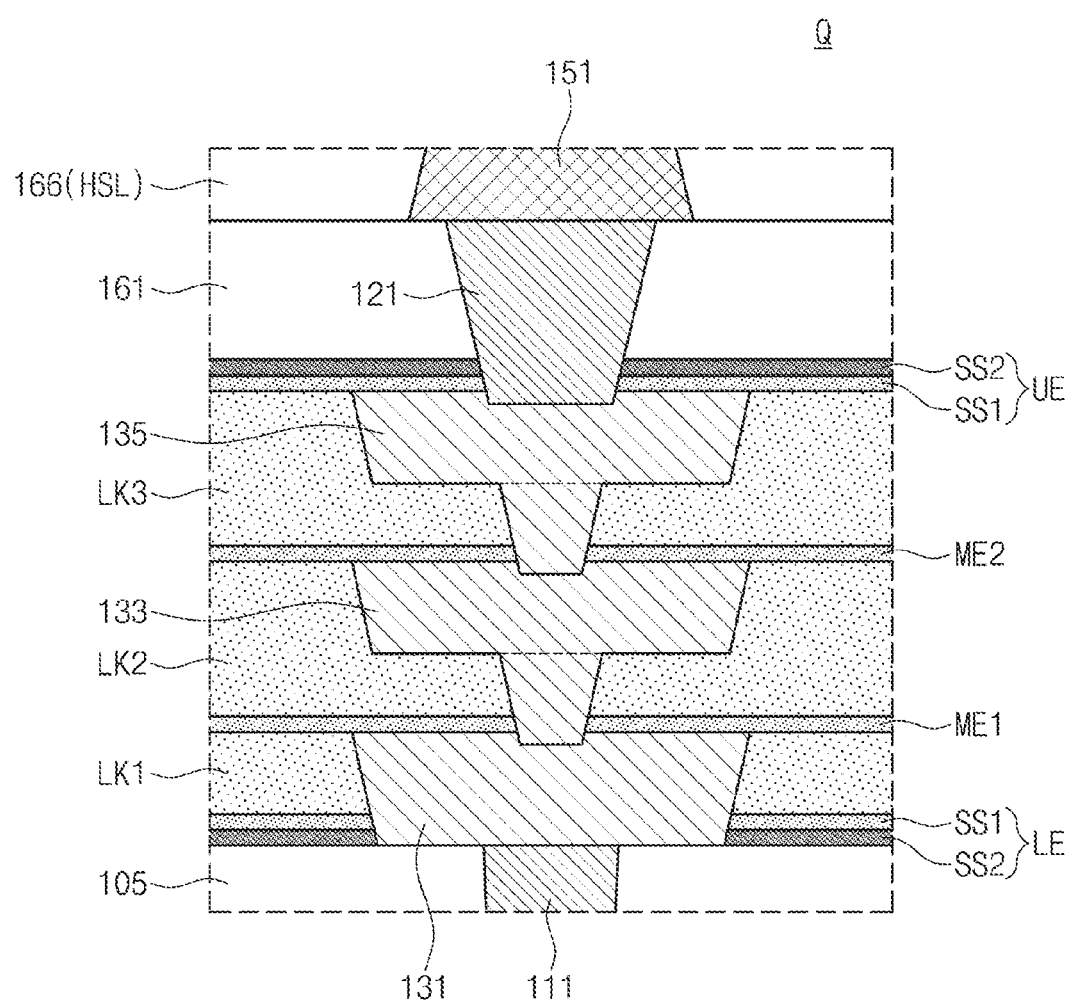
FIG. 10 illustrates an enlarged view showing section Q of FIG. 2.

FIG. 10 illustrates an enlarged view showing section Q of FIG. 2. In example embodiments that follow, each of the upper and lower interface layers UE and LE may include the first sub-interface layer SS1 and the second sub-interface layer SS2. In contrast, each of the first and second middle interface layers ME1 and ME2 need not include the second sub-interface layer SS2, but include a single layer consisting of the same material as that of the first sub-interface layer SS1. The upper interface layer UE may be configured such that the second sub-interface layer SS2 is provided on the first sub-interface layer SS1, while the lower interface layer LE may be configured such that the first sub-interface layer SS1 is provided on the second sub-interface layer SS2. The first sub-interface layer SS1 of the upper interface layer UE and the first sub-interface layer SS1 of the lower interface layer LE may be provided between the second sub-interface layer SS2 of the upper interface layer UE and the second sub-interface layer SS2 of the lower interface layer LE.

Figure 11:
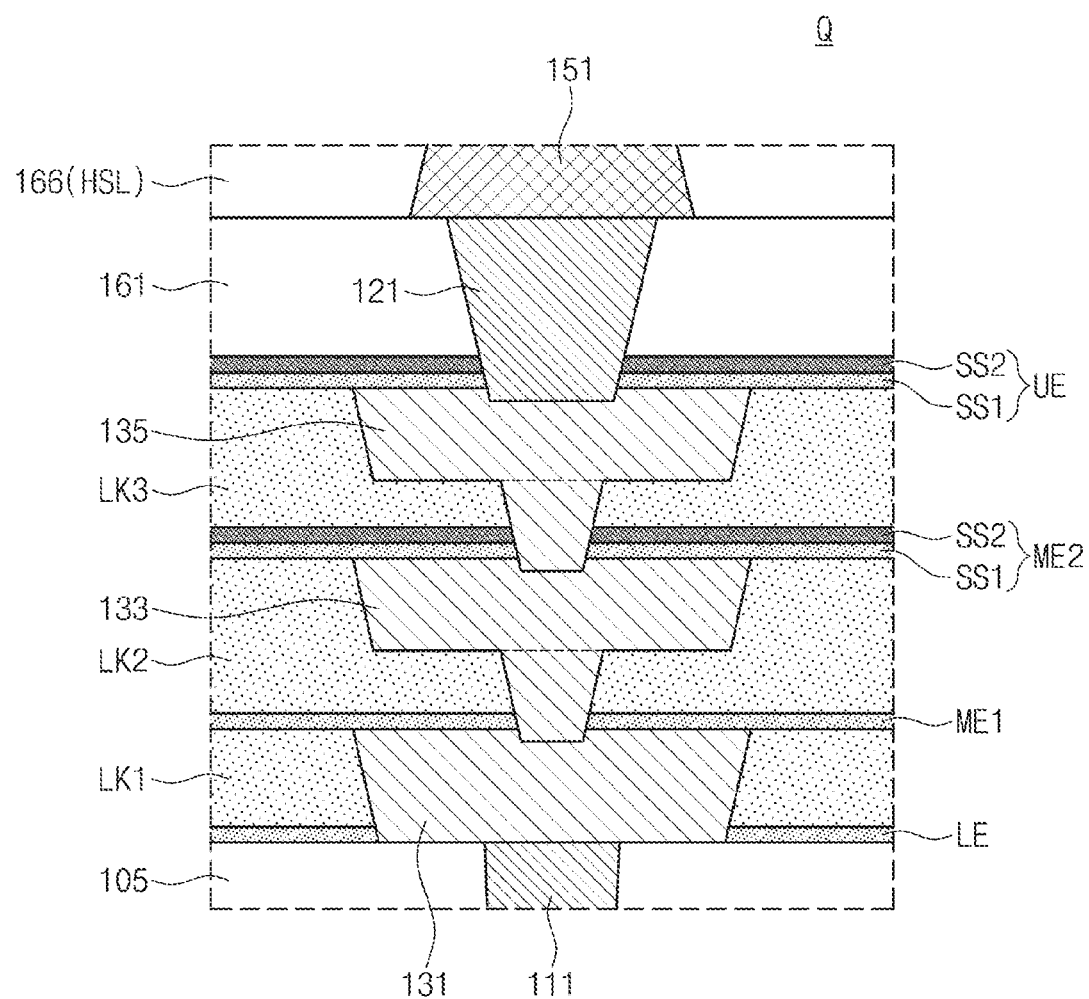
FIG. 11 illustrates an enlarged view showing section Q of FIG. 2.

FIG. 11 illustrates an enlarged view showing section Q of FIG. 2. In example embodiments that follow, either the upper interface layer UE or the lower interface layer LE may include the first and second sub-interface layers SS1 and SS2, and furthermore one or more of the first and second middle interface layers ME1 and ME2 may include the first and second sub-interface layers SS1 and SS2. For example, the second middle interface layer ME2 may include the first and second sub-interface layers SS1 and SS2.

Figure 12:
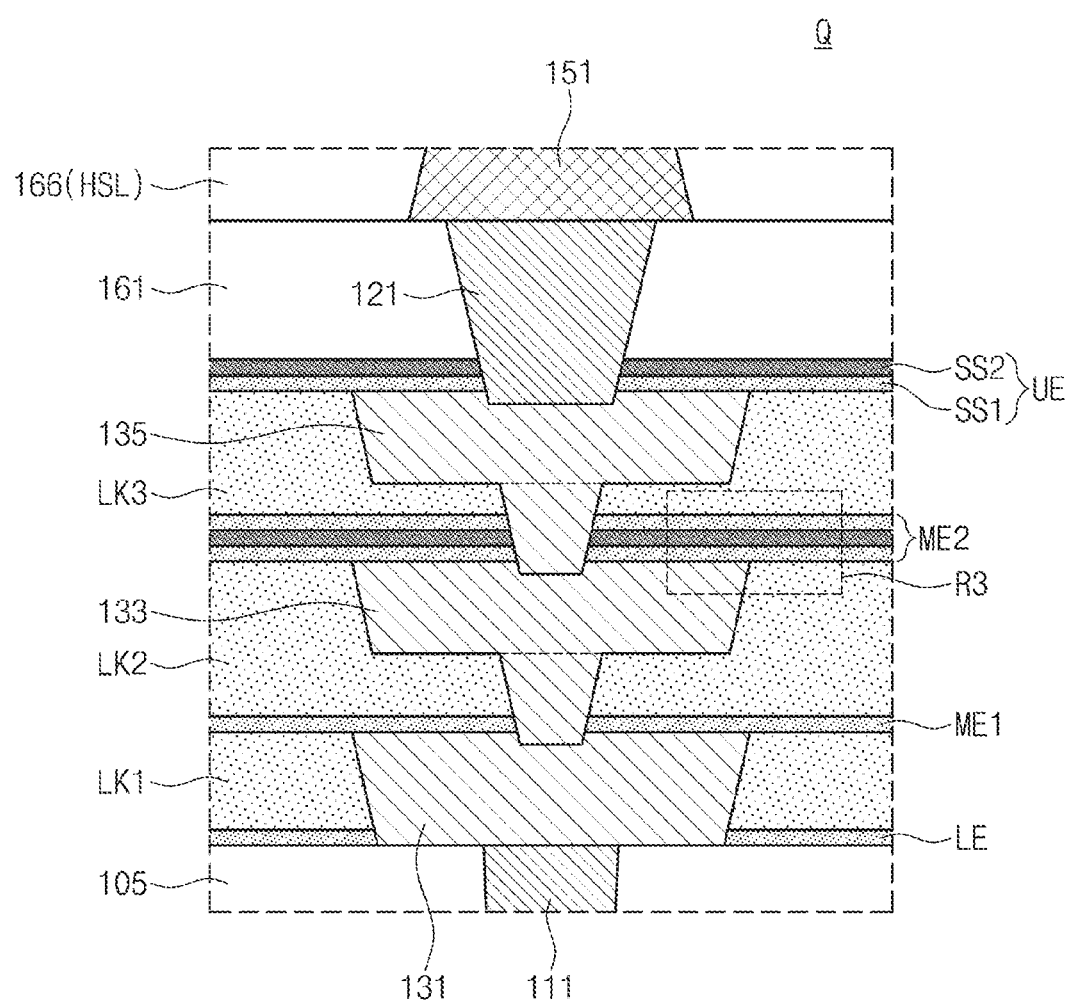
FIG. 12 illustrates an enlarged view showing section Q of FIG. 2.
Figure 13:
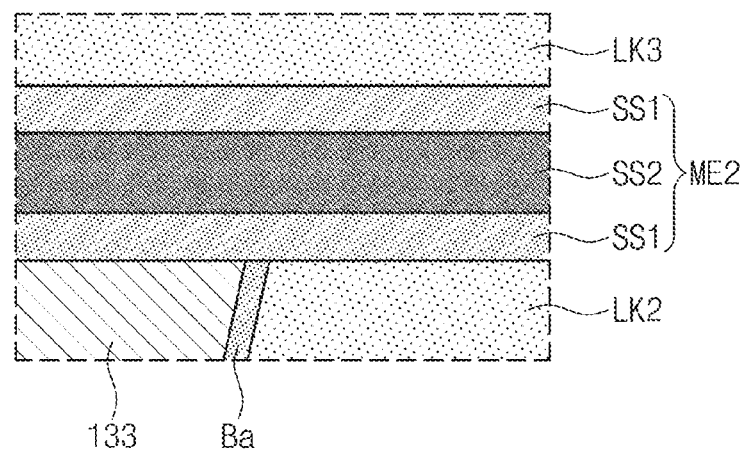
FIG. 13 illustrates an enlarged view showing section R3 of FIG. 12.

FIG. 12 illustrates an enlarged view showing section Q of FIG. 2. FIG. 13 illustrates an enlarged view showing section R3 of FIG. 12. Similar to example embodiments of FIG. 11, one or more of the first and second middle interface layers ME1 and ME2 may include a plurality of sub-interface layers. The second middle interface layer ME2 according to example embodiments may include a pair of the first sub-interface layers SS1 and the second sub-interface layer SS2 between the pair of the first sub-interface layers SS1. The first sub-interface layer SS1 in contact with a bottom surface of the second sub-interface layer SS2 may be in contact with the second low-k dielectric layer LK2, and the first sub-interface layer SS1 in contact with a top surface of the second sub-interface layer SS2 may be in contact with the third low-k dielectric layer LK3.

Figure 14:
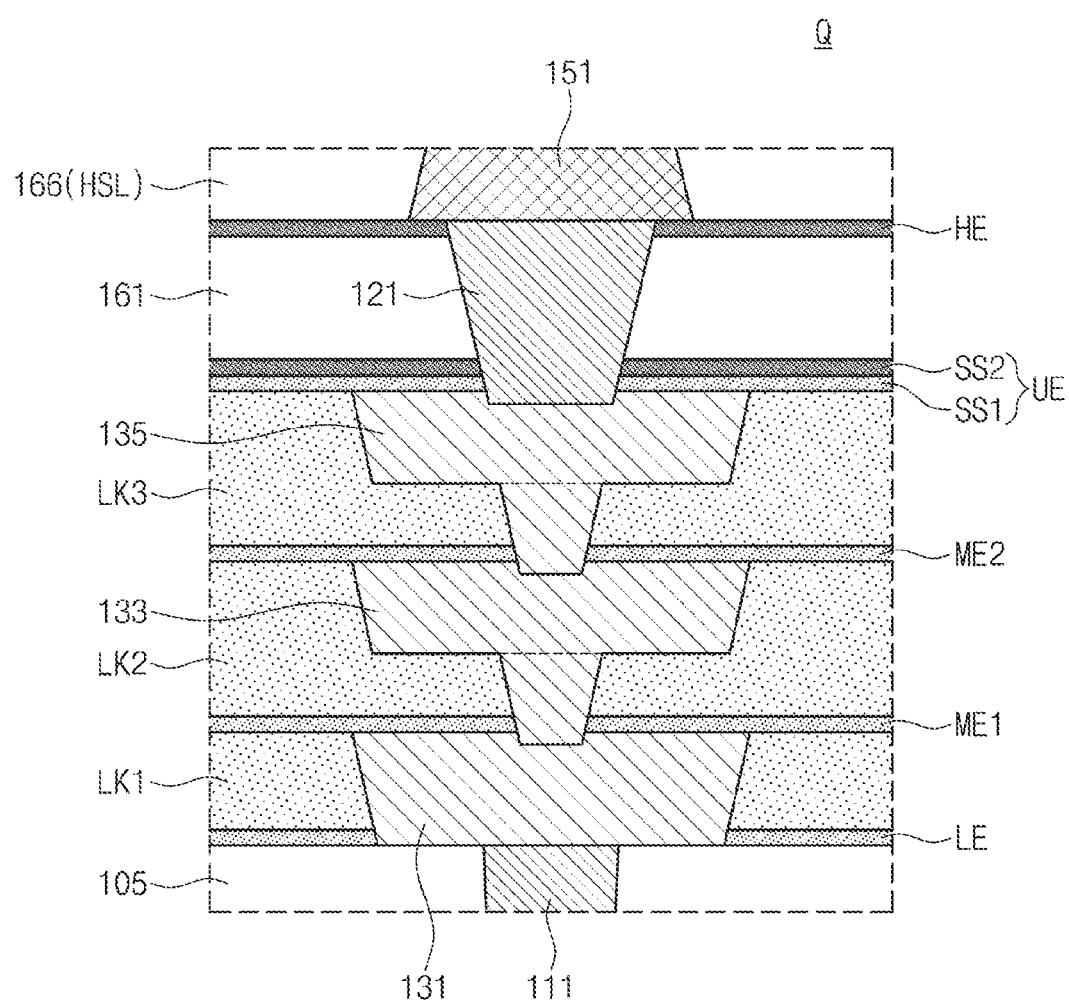
FIG. 14 illustrates an enlarged view showing section Q of FIG. 2.

FIG. 14 illustrates an enlarged view showing section Q of FIG. 2. In example embodiments that follow, either the upper interface layer UE or the lower interface layer LE may include the first and second sub-interface layers SS1 and SS2, and furthermore an upper-line interface layer HE may be provided between the first and second interlayer dielectric layers 161 and 166. The upper-line interface layer HE may be in contact with a bottom surface of the upper conductive line 151. For example, the upper-line interface layer HE may be a single layer consisting of the same material as that of the second sub-interface layer SS2. Alternatively, the upper-line interface layer HE may include the first and second sub-interface layers SS1 and SS2.

FIGS. 15 to 19 illustrate cross-sectional views taken along line I-I' of FIG. 1, showing a method of fabricating a semiconductor device according to example embodiments of inventive concepts.

Figure 15:
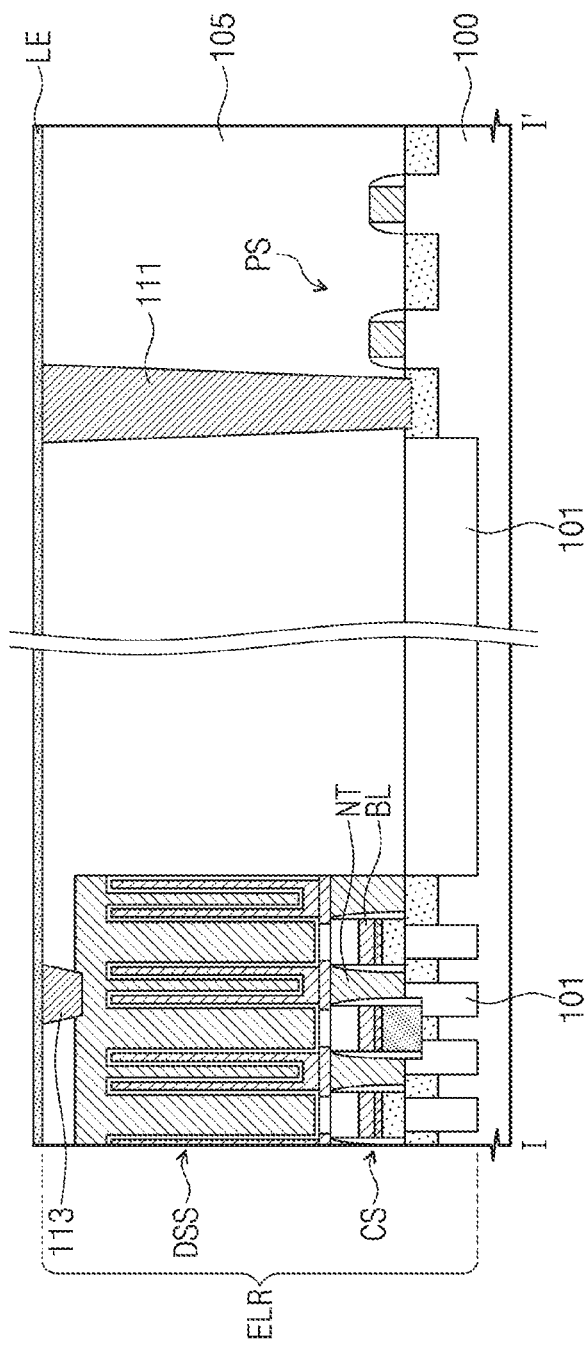
FIGS. 15 to 19 illustrate cross-sectional views taken along line I-I' of FIG. 1, showing a method of fabricating a semiconductor device according to example embodiments of inventive concepts.

Referring to FIGS. 1 and 15, a device region ELR may be formed on a substrate 100 including a cell array region CAR and a peripheral circuit region PCR. For example, a cell transistor section CS and a data storage structure DSS may be formed on the cell array region CAR of the substrate 100. For example, the formation of the cell transistor section CS may include forming cell transistors, and the formation of the data storage structure DSS may include forming capacitors. A peripheral transistor section PS may be formed on the peripheral circuit region PCR of the substrate 100. The formation of the peripheral transistor section PS may include forming a second active region ACT2 on an upper portion of the substrate 100 and forming a plurality of peripheral transistors on the substrate 100.

A lower interlayer dielectric layer 105 may be formed to cover the peripheral transistor section PS and the cell transistor section CS. For example, the lower interlayer dielectric layer 105 may have a dielectric constant equal to or more than 4.4. The lower interlayer dielectric layer 105 may be formed of, for example, BPSG (boro-phosphosilicate glass), TOSZ (tonen silazene), USG (undoped silicate glass), SOG (spin-on glass), FOX (flowable oxide), TEOS (tetraethylortho silicate), HDP CVD (high density plasma chemical vapor deposition) oxide, or HSQ (hydrogen silisesquioxane).

Contact holes may be formed to penetrate at least a portion of the lower interlayer dielectric layer 105, and then lower contacts 111 and 113 may be formed in the contact holes. For example, the lower contacts 111 and 113 may be formed of tungsten (W), titanium (Ti), tantalum (Ta), or nitride thereof. The lower contacts 111 and 113 may be formed by a deposition process such as sputtering or MOCVD. After the deposition process is performed, a planarization process such as chemical mechanical polishing may be performed to expose a top surface of the lower interlayer dielectric layer 105.

A surface treatment process may be performed on the exposed surface of the lower interlayer dielectric layer 105 that has experienced the planarization process. For example, the surface treatment process may include one or more of UV treatment, remote plasma treatment, direct plasma treatment, or gas treatment using $NH_3$, $H_2$, Ar, $N_2$, and/or $SiH_4$.

A lower interface layer LE may be formed on the lower interlayer dielectric layer 105. For example, as illustrated in FIG. 8, the lower interface layer LE may include a second sub-interface layer SS2 and a first sub-interface layer SS1 on the second sub-interface layer SS2. The first and second sub-interface layers SS1 and SS2 may be formed by, for example, PECVD (plasma enhanced chemical vapor deposition). The first and second sub-interface layers SS1 and SS2 may be in-situ formed, but not limited thereto.

Figure 16:
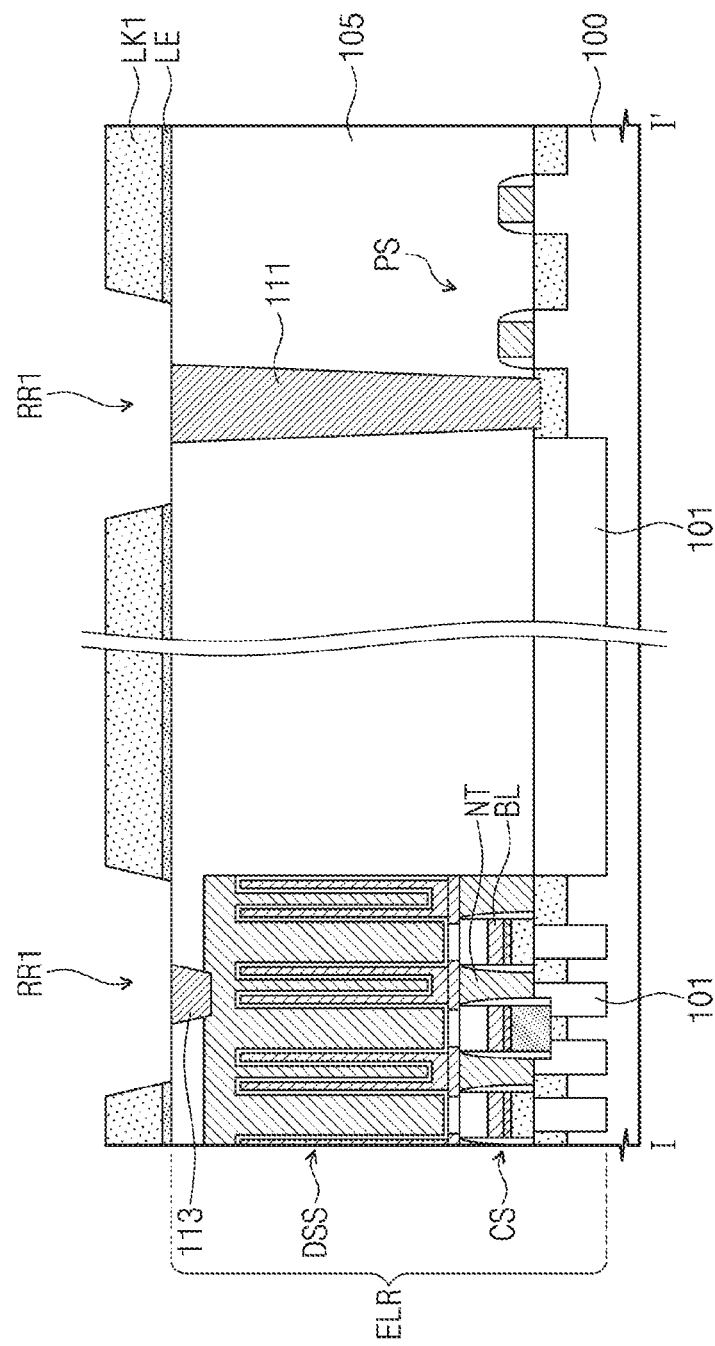

Referring to FIGS. 1 and 16, a first low-k dielectric layer LK1 may be formed on the lower interface layer LE. For example, the first low-k dielectric layer LK1 may be formed of SiCOH. A mask pattern may be formed on the first low-k dielectric layer LK1, and then an etching process may be performed to expose the lower contacts 111 and 113. The lower interface layer LE may serve as an etch stop layer when the etching process is performed. As a result, first recess regions RR1 may be formed in the first low-k dielectric layer LK1. The etching process may include a dry etching process and/or a wet etching process.

Figure 17:
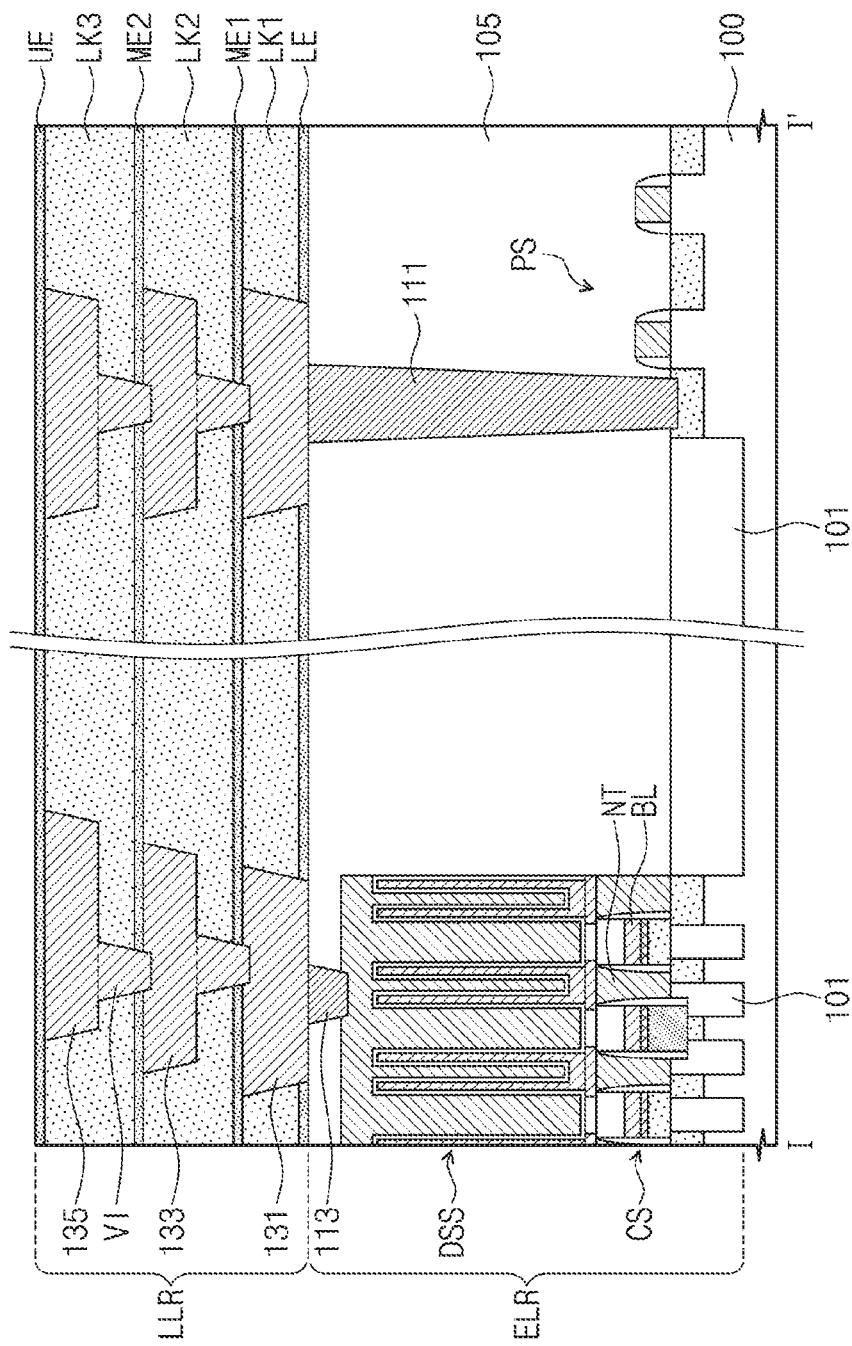

Referring to FIGS. 1 and 17, first conductive lines 131 may be formed to fill the first recess regions RR1. For example, the first conductive lines 131 may be formed by a damascene process using copper (Cu) or tungsten (W). Afterwards, the damascene process may be repeatedly performed to form second and third conductive lines 133 and 135. An upper interface layer UE may be formed to cover the third conductive lines 135. Before the upper interface layer UE is formed, a first middle interface layer ME1 may be formed on the first low-k dielectric layer LK1 and then a second low-k dielectric layer LK2 may be formed on the first middle interface layer ME1. A second middle interface layer ME2 may be formed on the second low-k dielectric layer LK2 and then a third low-k dielectric layer LK3 may be formed on the second middle interface layer ME2. The second and third low-k dielectric layers LK2 and LK3 may be formed identically to the first low-k dielectric layer LK1. The upper interface layer UE and its underlying middle interface layers ME1 and ME2 may be formed identically to the lower interface layer LE. Through the processes discussed above, a wiring region LLR may be partially formed on the device region ELR.

Figure 18:
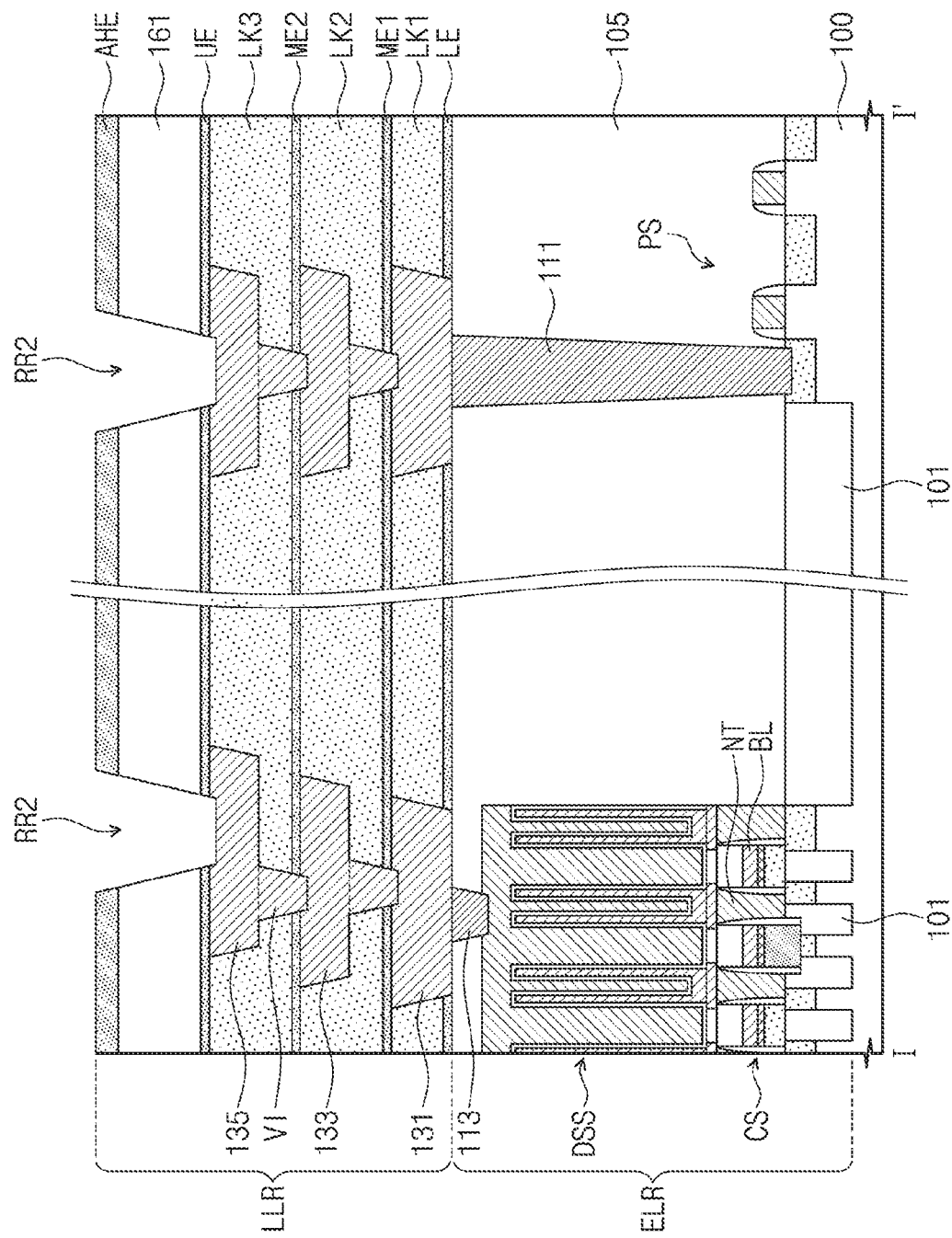

Referring to FIGS. 1 and 18, a first interlayer dielectric layer 161 may be formed on the upper interface layer UE. In the case of example embodiments illustrated in FIG. 14, a preliminary upper-line interface layer AHE may be formed on the first interlayer dielectric layer 161. A mask pattern may be formed on the preliminary upper-line interface layer AHE, and then an etching process may be performed to form second recess regions RR2 that penetrate the preliminary upper-line interface layer AHE and the first interlayer dielectric layer 161.

Figure 19:
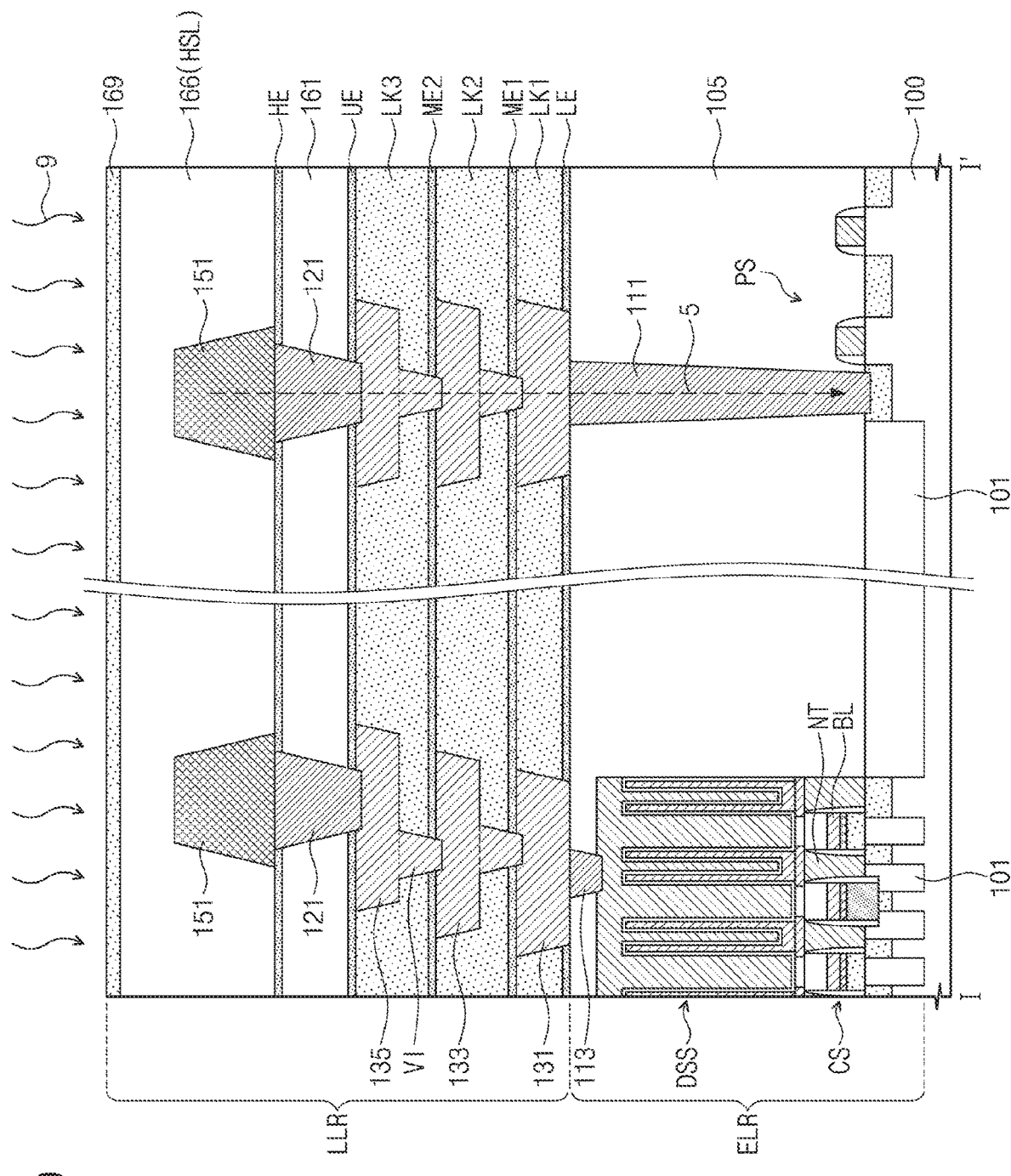

Referring to FIGS. 1 and 19, the second recess regions RR2 may be filled with a conductive material, and then a planarization process may be performed to form upper contacts 121. When the planarization process is performed, an upper portion of the preliminary upper-line interface layer AHE may be removed to form an upper-line interface layer HE. For example, the upper-line interface layer HE may be a polishing stop layer.

Upper conductive lines 151 may be formed on the upper-line interface layer HE. For example, the upper conductive lines 151 may include aluminum (Al). The formation of the upper conductive lines 151 may include forming and patterning a conductive layer. The patterning process may include RIE (reactive ion etching). A second interlayer dielectric layer 166 and a passivation layer 169 may be sequentially formed to cover the upper conductive lines 151. For example, the second interlayer dielectric layer 166 may be formed as a hydrogen supply layer HSL.

An alloy process 9 may be performed. The alloy process 9 may cause that the transistors on the substrate 100 are supplied with hydrogen from the second interlayer dielectric layer 166 as the hydrogen supply layer HSL. The alloy process 9 may include heat treatment that continues for tens to hundreds of minutes at a temperature ranging from about 300° C. to about 500° C. When the heat treatment is carried out, heat may be provided to the passivation layer 169 and then transferred through a hydrogen supply path 5. The passivation layer 169 may prevent hydrogen from being transferred in a reverse direction reverse to a transfer direction along the hydrogen supply path 5.

According to some embodiments of inventive concepts, an interface layer may be provided to include first and second sub-interface layers having different characteristics from each other. Therefore, an alloy process may be performed more efficiently, and an interface adhesion force may be increased between insulation layers.

A semiconductor device according to some embodiments of inventive concepts may provide hydrogen to transistors and thus increase in electrical characteristics. Furthermore, the semiconductor device may concentrate hydrogen onto a hydrogen supply path in the alloy process, thereby increasing efficiency of the alloy process.

The aforementioned description provides exemplary embodiments for explaining inventive concepts. Therefore, inventive concepts are not limited to the embodiments described above, and it will be understood by one of ordinary skill in the art that variations in form and detail may be made therein without departing from the spirit and essential features of inventive concepts.

What is claimed is:

1. A semiconductor device, comprising:
a device region on a substrate;
an interlayer dielectric layer on the device region;
a first interface layer on a side of the interlayer dielectric layer;
a low-k dielectric layer spaced apart from the interlayer dielectric layer with the first interface layer and having a dielectric constant less than that of the interlayer dielectric layer; and
a conductive line in the low-k dielectric layer,
wherein the first interface layer comprises:
a first sub-interface layer in contact with the low-k dielectric layer; and
a second sub-interface layer in contact with the interlayer dielectric layer,
the second sub-interface layer having hydrogen permeability less than that of the first sub-interface layer, and
the first sub-interface layer includes SiCN, and the second sub-interface layer includes SiN.

2. The semiconductor device of claim 1, further comprising a hydrogen supply layer on the interlayer dielectric layer.

3. The semiconductor device of claim 1, wherein a dielectric constant of the first sub-interface layer is less than a dielectric constant of the second sub-interface layer.

4. The semiconductor device of claim 3, wherein the dielectric constant of the first sub-interface layer is less than 6, and the dielectric constant of the second sub-interface layer is equal to or more than 6.

5. The semiconductor device of claim 1, wherein a density of the second sub-interface layer is greater than a density of the first sub-interface layer.

6. The semiconductor device of claim 1, wherein an interface adhesion force between the first sub-interface layer and the low-k dielectric layer is greater than an interface adhesion force between the second sub-interface layer and the low-k dielectric layer.

7. The semiconductor device of claim 1, wherein
the interlayer dielectric layer is on the low-k dielectric layer,
the first sub-interface layer is in contact with a top surface of the low-k dielectric layer, and
the second sub-interface layer is in contact with a bottom surface of the interlayer dielectric layer.

8. The semiconductor device of claim 7, wherein the first sub-interface layer is in contact with a top surface of the conductive line.

9. The semiconductor device of claim 1, wherein
the low-k dielectric layer is on the interlayer dielectric layer,
the second sub-interface layer is in contact with a top surface of the interlayer dielectric layer, and
the first sub-interface layer is in contact with a bottom surface of the low-k dielectric layer.

10. The semiconductor device of claim 1, wherein the low-k dielectric layer is a plurality of low-k dielectric layers, and
wherein the semiconductor device further comprises second interface layers between the plurality of low-k dielectric layers,
at least one of the second interface layers comprising a first sub-interface layer and a second sub-interface layer.

11. The semiconductor device of claim 1, wherein the low-k dielectric layer is a plurality of low-k dielectric layers, and
the semiconductor device further comprises a second interface layer between the plurality of low-k dielectric layers,
the second interface layer comprising a plurality of first sub-interface layers and a second sub-interface layer between the plurality of first sub-interface layers.

12. The semiconductor device of claim 1, wherein the second sub-interface layer is thicker than the first sub-interface layer.

13. The semiconductor device of claim 12, wherein a thickness of the second sub-interface layer is about 2 times to about 10 times a thickness of the first sub-interface layer.

14. The semiconductor device of claim 1, wherein the interlayer dielectric layer comprises a first interlayer dielectric layer and a second interlayer dielectric layer on the first interlayer dielectric layer, and wherein the semiconductor device further comprises:

an upper conductive line in the second interlayer dielectric layer; and a third interface layer between the first interlayer dielectric layer and the second interlayer dielectric layer.

15. The semiconductor device of claim 14, wherein the third interface layer comprises a second sub-interface layer.

16. A semiconductor device, comprising:

a device region on a substrate;

a low-k dielectric layer on the device region and including a conductive line therein;

an upper interlayer dielectric layer on the low-k dielectric layer;

a hydrogen supply layer on the upper interlayer dielectric layer; and an upper interface layer between the low-k dielectric layer and the upper interlayer dielectric layer, wherein the upper interface layer comprises a first sub-interface layer and a second sub-interface layer on the first sub-interface layer, the second sub-interface layer having hydrogen permeability less than that of the first sub-interface layer.

17. The semiconductor device of claim 16, further comprising:

a lower interlayer dielectric layer below the low-k dielectric layer; and a lower interface layer between the lower interlayer dielectric layer and the low-k dielectric layer, wherein the lower interface layer comprises a second sub-interface layer and a first sub-interface layer that are sequentially stacked.

18. The semiconductor device of claim 16, wherein the upper interface layer comprises a recession between the second sub-interface layer and the first sub-interface layer.

19. A semiconductor device, comprising:

a device region on a substrate;

a plurality of low-k dielectric layers on the device region, each of the plurality of low-k dielectric layers including a conductive line therein;

an interlayer dielectric layer on the low-k dielectric layers;

a hydrogen supply layer on the interlayer dielectric layer; and an upper interface layer between the interlayer dielectric layer and an uppermost one of the low-k dielectric layers, wherein the upper interface layer comprises a low-k dielectric interface layer and a hydrogen blocking layer on the low-k dielectric interface layer, the hydrogen blocking layer having a density greater than that of the low-k dielectric interface layer.

20. The semiconductor device of claim 19, wherein a dielectric constant of the low-k dielectric interface layer is less than 6, and a dielectric constant of the hydrogen blocking layer is equal to or more than 6.

* * * * *